US006762453B1

(12) United States Patent
Simacek et al.

(10) Patent No.: US 6,762,453 B1
(45) Date of Patent: Jul. 13, 2004

(54) PROGRAMMABLE MEMORY TRANSISTOR

(75) Inventors: Thomas K. Simacek, Greentown, IN (US); Thomas W. Kotowski, Noblesville, IN (US); Jack L. Glenn, Kokomo, IN (US); Alireza F. Borzabadi, Carmel, IN (US)

(73) Assignee: Delphi Technologies, Inc., Troy, MI (US)

( * ) Notice: Subject to any disclaimer, the term of this patent is extended or adjusted under 35 U.S.C. 154(b) by 48 days.

(21) Appl. No.: 10/324,346

(22) Filed: Dec. 19, 2002

(51) Int. Cl.[7] .............................................. H01L 29/788
(52) U.S. Cl. ...................... 257/318; 257/321; 257/322
(58) Field of Search ............................... 257/316, 318, 257/321, 322

(56) References Cited

U.S. PATENT DOCUMENTS

| 6,034,893 | A | * | 3/2000 | Mehta | 257/318 |
| 6,044,018 | A | | 3/2000 | Sung et al. | 365/185.18 |
| 6,177,703 | B1 | | 1/2001 | Cunningham | 257/321 |
| 6,191,980 | B1 | | 2/2001 | Kelley et al. | 365/185.29 |
| 6,215,700 | B1 | * | 4/2001 | Fong et al. | 365/185.1 |
| 6,324,097 | B1 | | 11/2001 | Chen et al. | 365/185.1 |
| 6,326,663 | B1 | * | 12/2001 | Li et al. | 257/318 |
| 6,570,212 | B1 | * | 5/2003 | Mehta | 257/315 |

* cited by examiner

*Primary Examiner*—Gene M. Munson
(74) *Attorney, Agent, or Firm*—Stefan V. Chmielewski

(57) ABSTRACT

A programmable memory transistor (PMT) comprising an IGFET and a coupling capacitor in a semiconductor substrate. The IGFET comprises source and drain regions, a channel therebetween, a gate insulator overlying the channel, and a first floating gate over the gate insulator. The capacitor comprises a lightly-doped well of a first conductivity type, heavily-doped contact and injecting diffusions of opposite conductivity types in the lightly-doped well, a control gate insulator overlying a surface region of the lightly-doped well between the contact and injecting diffusions, a second floating gate on the control gate insulator, and a conductor contacting the lightly-doped well through the contact and injecting diffusions. The first and second floating gates are preferably patterned from a single polysilicon layer, such that the second floating gate is capacitively coupled to the lightly-doped well, and the latter defines a control gate for the first floating gate.

9 Claims, 4 Drawing Sheets

PROGRAMMABLE MEMORY TRANSISTOR

CROSS REFERENCE TO RELATED APPLICATIONS

Not applicable.

STATEMENT REGARDING FEDERALLY SPONSORED RESEARCH

Not applicable.

BACKGROUND OF THE INVENTION (1) Field of the Invention

The present invention generally relates to semiconductor devices. More particularly, this invention relates to a programmable memory transistor having a floating gate that exhibits improved voltage retention.

(2) Description of the related art

Programmable memory transistors (PMT), including electrically programmable read only memory (EPROM) and electrically erasable programmable read only memory (EEPROM) devices, are a type of insulated gate field effect transistor (IGFET) having nonvolatile memory. As used in the art, "nonvolatile" refers to the retention of memory without the need of a power source, here by trapping a charge on a "floating" gate disposed above the IGFET channel region and typically below a conventional control gate electrode, such that the control and floating gates are "stacked." The floating gate is described as "floating" because it is electrically insulated from the channel region by a gate oxide, typically insulated from the control gate by a "tunnel" oxide, and not directly accessed by any electrical conductor. PMT's can be electrically programmed after manufacture by placing an electrical charge on the floating gate by the effects of tunneling or avalanche injection from the control gate electrode through the tunnel oxide. Once an electrical charge is placed on the floating gate, the charge is trapped there until it is deliberately removed, such as by exposure to ultraviolet light. The trapped charge on the PMT floating gate raises the threshold voltage of the underlying channel region of the IGFET, thus raising the "turn on" voltage of the IGFET to a value above the voltage otherwise required for the IGFET. Accordingly, the IGFET stays "off" even when a normal turn-on voltage is applied to its control gate electrode.

Stacked control and floating gates require two separate conductor layers, typically polysilicon, resulting in a double-polysilicon ("Poly1/Poly2") device structure. PMT's are typically fabricated in the same semiconductor substrate as MOS (metal-oxide-semiconductor) transistors, which are single-polysilicon layer structures and therefore require fewer patterning steps than PMT's. Therefore, PMT's have been proposed that make use of a single polysilicon layer, such as that disclosed in U.S. Pat. No. 6,324,097. An example of another single-polysilicon PMT is shown in FIG. 1, in which a PMT 110 is fabricated on a semiconductor substrate 112 doped with an N-type impurity. A P-well 114 is formed in a surface region of the substrate 112, and divided by a field oxide 116 into two active regions. An NMOS transistor 118 is formed in one of the active regions and conventionally includes source and drain regions 120 and 122 in the P-well 114, a channel 124 between the source and drain regions 120 and 122, and a gate electrode 126 separated from the channel 124 by a gate insulator 128 (e.g., silicon dioxide). Source and drain metal 130 and 132 make ohmic contact with the source and drain regions 120 and 122, respectively. The gate electrode 126 of the NMOS transistor 118 is a floating gate, in that it is not directly connected to a gate metal or other conductor. Instead, the gate electrode 126 is defined by a single polysilicon layer that also defines a second floating gate 146 of a control gate structure 138 fabricated in the second active region of the substrate 112 (on the right-hand side of FIG. 1). The control gate structure 138 represented in FIG. 1 includes two N+ contact diffusions 142 within an N-well 144 (though a single contact diffusion 142 or more than two contact diffusions 142 could be present). The N-well 144 serves as the control gate of the control gate structure 138, effectively replacing the second polysilicone layer of a conventional double-polysilicon PMT. The control gate (N-well) 144 is separated from the second floating gate 146 by a gate oxide 148, creating what is effectively a coupling capacitor. A control gate metal 150 contacts the N+ contact diffusions 142 to provide ohmic contact with the control gate 144.

When programming the prior art PMT 110, an electrical charge is placed on the floating gate 126 of the NMOS transistor 118 by the effect of tunneling or avalanche injection from the channel 124 of the gate electrode 126 through the gate insulator 128 to the floating gate 126. For this purpose, a sufficiently high potential must be applied to the control gate metal 150 to capacitively induce a charge in the floating gate 146 as well as the floating gate 126 as a result of the gates 126 and 146 being formed of the same polysilicon layer. Simultaneously, the drain region 122 is biased at a high voltage level while the source region 120 and substrate 112 are electrically connected to ground, so that electrons are ejected from the drain region 122 through the gate insulator 128 into the floating gate 126.

Because of the large interfacial barrier energy provided by the gate insulator 128, a charge stored onto the floating gate 126 has a long intrinsic storage time. For PMT's of the type shown in FIG. 1, the measured mean decay of a stored potential (Vth) may be about 0.2V/decade-hours at 160° C. Assuming an initial programmed mean Vth of about 8V, it would require about $10^{21}$ years for the PMT to discharge to a Vth of 3V. At the end of ten years, the leakage would have dropped to an average of one electron per day. Vth degradation in the PMT 110 is the result of and limited by physical processes. The magnitudes of the electric field and temperature dictate what conduction processes will be dominant. There are three distinct phases of Vth degradation for nominal PMT's, each associated with a different possible physical mechanism of charge distribution/conduction and each having its own empirical "activation energy." First there is an initial period of rapid Vth loss, which is believed to be associated with the depolarization/dielectric absorption behavior observed to a lesser or greater degree in all capacitor dielectrics. Second, there is an intermediate period of charge loss associated with a high (but less than 6 Mvolt/cm, where Fowler-Nordheim tunneling is dominant) but decaying electric field. It is possible that there is movement of trapped electrons during this intermediate period, which has an "activation energy" of about 0.2 eV. Ultimately, there is a long period of low field leakage through the gate insulator. The low field conduction mechanism is generally accepted as being conduction by thermionic emission.

When subjected to elevated temperatures, e.g., 160° C. or more, PMT's experience a significant initial drop in Vth attributed to the first degradation phase noted above. Thereafter, Vth stabilizes, though continuing to drop at a much lower rate attributed to the second and third degradation phases noted above. This lower rate is sufficiently low to permit the reliability of the device to be judged based on the initial Vth drop. Accordingly, PMT's typically undergo a data retention bake, or stress test, that involves baking at a sufficiently high temperature to cause the initial drop in Vth. A PMT is deemed to have passed the stress test if its Vth has not dropped below a predetermined level at the completion of the high temperature bake.

From the above, it can be appreciated that PMT's capable of exhibiting more stable Vth, corresponding to improved reliability and memory retention time, would be desirable. It would also be desirable to eliminate the requirement for a stress test to ascertain reliability of a PMT.

BRIEF SUMMARY OF THE INVENTION

The present invention is directed to a programmable memory transistor (PMT) that exhibits significantly better performance in terms of charge retention and reliability. The PMT of this invention is able to make use of a single polysilicon layer, and is capable of memory retention times of five orders of magnitude greater than similar single-polysilicon PMT's. The PMT also provides improved testability as a result of a greater measurement sensitivity for defects.

The PMT of this invention generally comprises an insulated gate field effect transistor (IGFET) and a capacitor structure on a semiconductor substrate. The IGFET comprises source and drain regions in a surface of the substrate, a channel between the source and drain regions, a gate insulator overlying the channel, and a first floating gate on the gate insulator. The capacitor structure comprises a lightly-doped well of a first conductivity type in the surface of the substrate, a heavily-doped first diffusion of the first conductivity type in the lightly-doped well, and a second diffusion of a second conductivity type in the lightly-doped well and spaced apart from the first diffusion so as to define therebetween a surface region of the lightly-doped well. The capacitor structure further comprises a control gate insulator that overlies the surface region of the lightly-doped well, a second floating gate on the control gate insulator, and a conductor in ohmic contact with the lightly-doped well through the first diffusion and in further contact with the lightly-doped well through the second diffusion. The first and second floating gates are electrically connected, preferably as a result of being formed of the same polysilicon layer, to maintain the first and second floating gates at the same potential.

As a result of the above structure, the second floating gate is capacitively coupled to the lightly-doped well through the control gate insulator so as to define a control gate for the first floating gate. As such, a sufficient voltage can be applied to the lightly-doped well to cause ejection of electrons from the drain region of the insulated gate field effect transistor and trap some of the ejected electrons in the first floating gate. According to the invention, PMT's fabricated with the oppositely-doped diffusions as described above do not experience the initial drop in Vth that occurs with conventional single-polysilicon PMT's when exposed to elevated temperatures, e.g., during a data retention bake. As such, the PMT of this invention is capable of far superior data retention over comparable single-polysilicon PMT's. An additional benefit of the invention is the ability to simplify and/or shorten the aforementioned stress test performed on conventional PMT's to evaluate device reliability on the basis of the initial Vth drop.

Other objects and advantages of this invention will be better appreciated from the following detailed description.

DETAILED DESCRIPTION OF THE INVENTION

Figure 1:
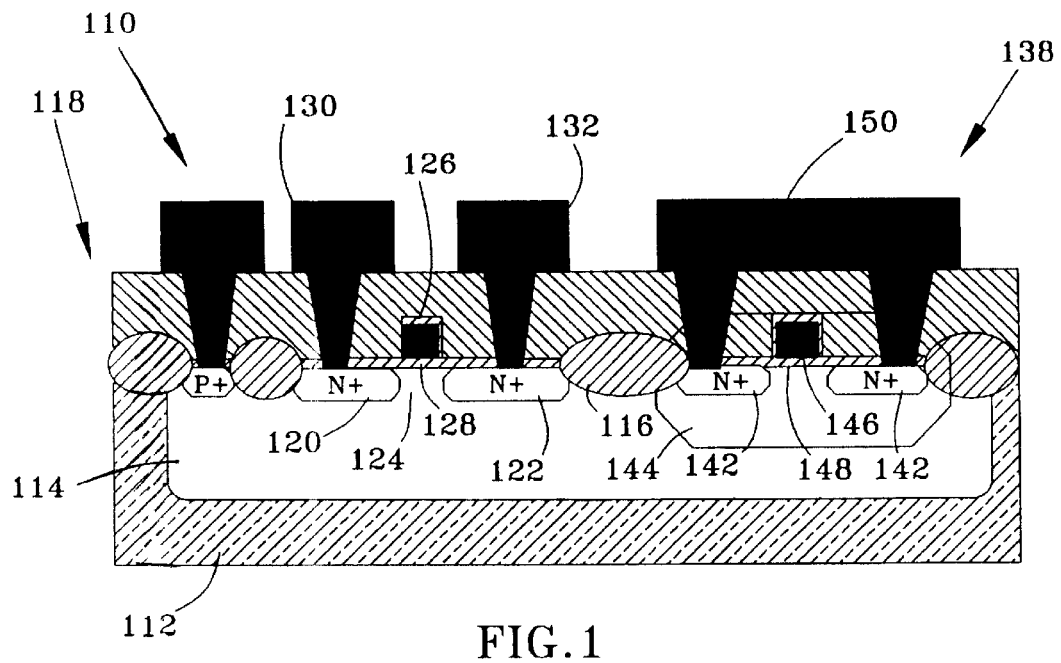
FIG. 1 is a schematic cross-sectional view of a programmable memory transistor in accordance with the prior art.
Figure 2:
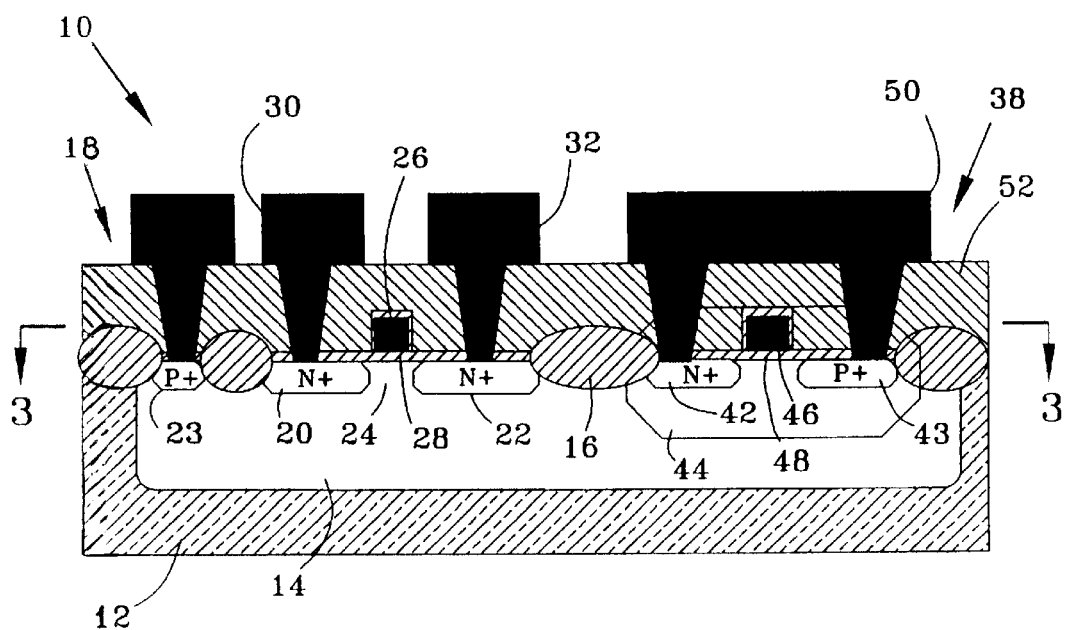
FIGS. 2 and 3 are schematic cross-sectional and plan views, respectively, of a programmable memory transistor in accordance with the present invention.
Figure 3:
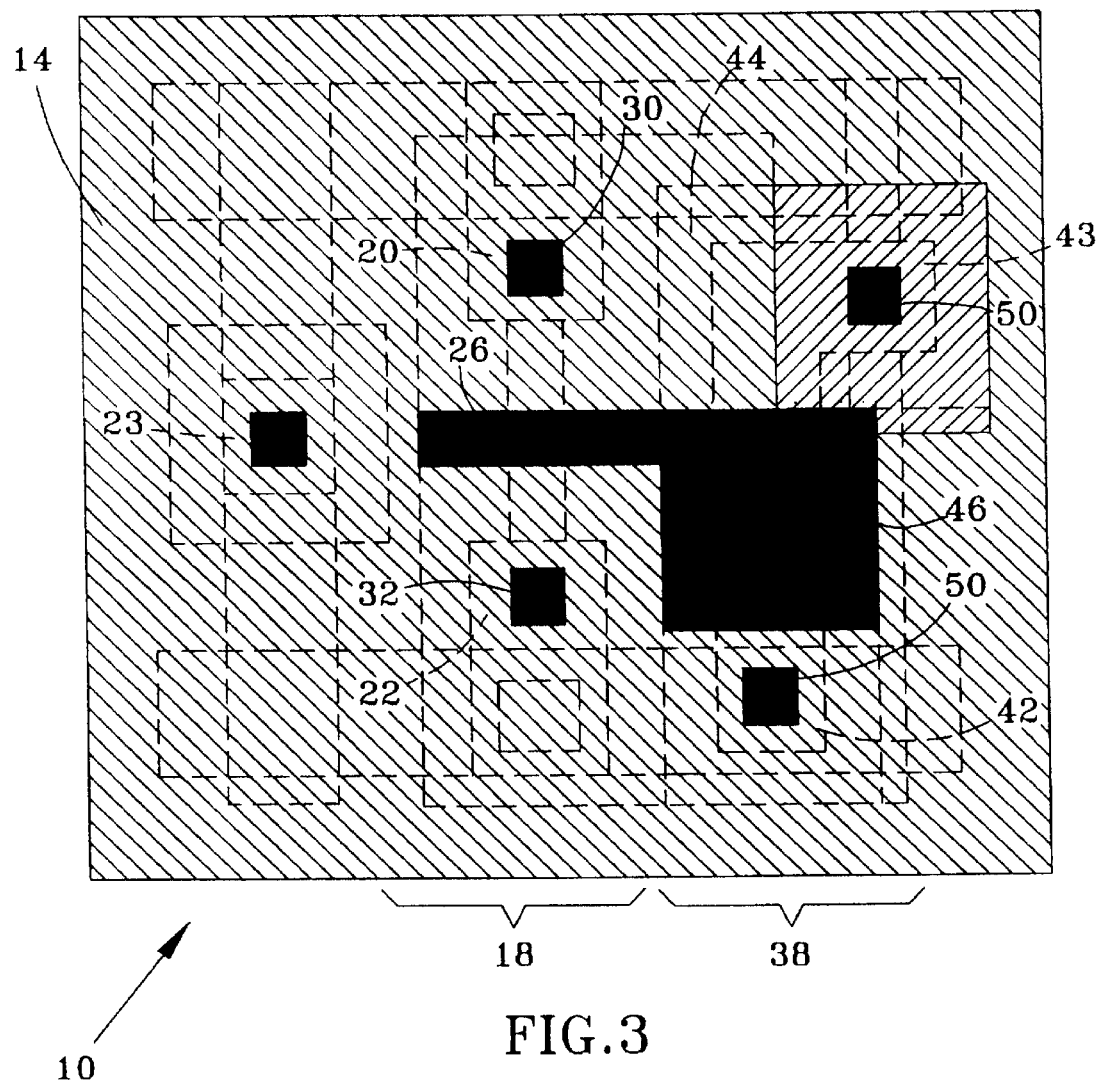

FIGS. 2 and 3 schematically represent a single-polysilicon PMT 10 capable of exhibiting superior memory retention in accordance with the present invention. The PMT 10 is similar to prior art double-polysilicon ("Poly1/Poly2") PMT's except that the second polysilicon layer is replaced with a lightly-doped well. The PMT 10 differs from prior art single-polysilicon PMT's (e.g., FIG. 1) by the use of diffusions of opposite conductivity type within a lightly-doped well that defines the control gate for the PMT, the effect of which is improved memory retention resulting from the elimination of the initial Vth drop observed with prior art single-polysilicon PMT's.

As seen in FIG. 2, the PMT 10 is fabricated on a silicon (preferably monocrystalline) substrate 12 doped with an N-type impurity, e.g., phosphorus, arsenic or another pentavalent element. A suitable doping level for the substrate 12 is on the order of about $5 \times 10^5$ cm$^{-2}$. A P-well 14 is formed in a surface region of the substrate 12 by doping with boron or another trivalent element at a level of about $5 \times 10^6$ cm$^{-2}$. A field oxide 16 divides the P-well 14 into two active regions, one of which is occupied by an NMOS transistor 18, while the other is occupied by a coupling capacitor 38. The NMOS transistor 18 is formed to conventionally include source and drain regions 20 and 22 in the P-well 14, a channel 24 between the source and drain regions 20 and 22, and a polysilicon floating gate electrode 26 separated from the channel 24 by a gate oxide 28. The source and drain regions 20 and 22 are more heavily doped than the substrate 12, preferably at a level of about $1 \times 10^{20}$ cm$^{-2}$. Source and drain metal 30 and 32 make ohmic contact with the source and drain regions 20 and 22, respectively. Also shown in FIG. 2 is a third region 23 heavily doped p-type for making ohmic contact with the P-well 14.

The polysilicon floating gate electrode 26 of the NMOS transistor 18 is formed by a layer of polysilicon that also defines a floating gate electrode 46 of the coupling capacitor 38. The floating gate electrode 46 overlies a tunneling oxide 48 above a surface region of a lightly-doped N-type (NHV) diffusion 44. The NHV diffusion 44 is preferably doped at a level of about $2 \times 10^7$ cm$^{-2}$. Two diffusions 42 and 43 are shown as being formed within the NHV diffusion 44, a first of which is a contact diffusion 42 heavily doped n-type, such as on the order of about $1 \times 10^{20}$ cm$^{-2}$. In contrast, the second diffusion is an injecting diffusion 43 heavily doped p-type, such as on the order of-about $1 \times 10^{20}$ cm$^{-2}$. The floating gate electrode 46 serves as an upper capacitor plate of the coupling capacitor 38. The channel between the diffusions 42 and 43 in the NHV diffusion 44 serves as the second capacitor plate of the coupling capacitor 38 and the control gate for the NMOS transistor 18. A control gate metal 50 contacts both the N+contact diffusion 42 and the P+ injecting diffusion 43 through a dielectric layer 52 overlying the surface of the substrate 12. Those skilled in the art will appreciate that conventional MOS processing can be used to form the PMT shown in FIG. 2, such that specific processing steps and techniques will not be discussed here in any detail.

According to conventional practice, the N+ contact diffusion 42 provides ohmic contact with the NHV diffusion 44. As a result of its opposite conductivity type, the P+ injecting diffusion 43 does not provide ohmic contact with the NHV diffusion 44. Instead, and according to the present invention, the P+ injecting diffusion 43 provides what is termed herein a "stitch" contact, and is believed to source holes into a P-type inversion layer at the surface of the NHV diffusion 44 when the PMT 10 is being programmed. The presence of the P+ injecting diffusion 43 has been demonstrated to greatly improve the memory retention of the PMT 10 as compared to a PMT that differs by having a pair of N+ contact diffusions (e.g., FIG. 1). In addition to its performance advantages, all layers used in the PMT 10 are core process layers in NMOS processes, enabling the coupling capacitor 38 and the NMOS transistor 18 (as will as other MOS devices) to be fabricated simultaneously in the same substrate 12.

In an investigation leading to the present invention, PMT's in accordance with FIG. 1 ("control") and FIG. 2 were processed side-by-side on a PMT test array. The PMT's were fabricated on a monocrystalline silicon substrate with a twelve micrometer-thick N-type epitaxy having an impurity concentration of about $5 \times 10^5$ cm$^{-2}$. P-wells were formed in surface regions of the substrate by doping with boron at a level of about $5 \times 101^6$ cm$^{-2}$ to a depth of about four micrometers. The source and drain regions of the NMOS transistors and the N+ contact diffusions of the coupling capacitors were heavily doped with arsenic to a level of about $1 \times 10^{20}$ cm$^{-2}$ and a depth of about 0.4 micrometers, while the P+ injecting diffusions of the PMT's of this invention and the P-well contact were heavily doped with boron to a level of about $1 \times 10^{20}$ cm$^{-2}$ and a depth of about 0.4 micrometers. After forming the gate oxide and tunneling oxide layers (about 250 Angstroms), the floating gates were patterned from a single layer of polysilicon deposited by low pressure chemical vapor deposition (LPCVD) to a thickness of about 3500 Angstroms.

All devices were erased with a deep UV bake and then programmed from an initial Vth of about 2V. Programming the PMT's involved applying drain and gate voltages to the NMOS for a few milliseconds or less. With the source region grounded, a positive voltage of less than the NMOS breakdown voltage (BVdss) was applied through a current limiting resistor to the drain region and a positive voltage on the order of about 3 MV/cm applied to the control gate metal of each device, with the result that "hot" electrons were ejected from the drain regions and became stored on the polysilicon floating gates.

Figure 4:
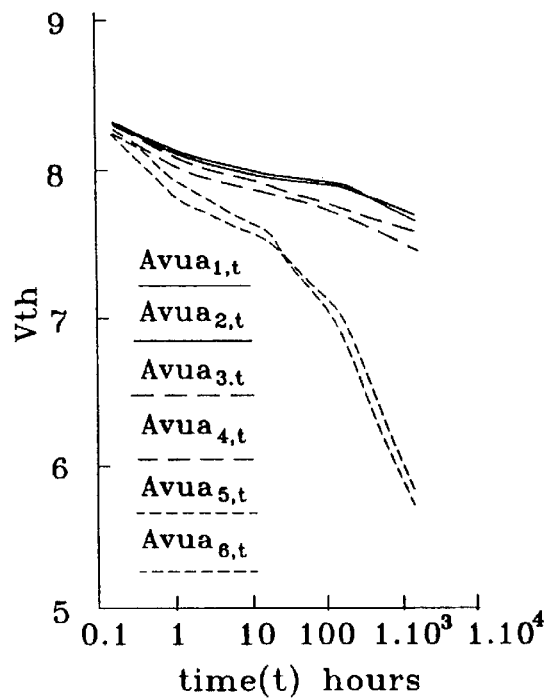
FIGS. 4 through 9 are graphs comparing the voltage retention characteristics of programmable memory transistors configured in accordance with FIGS. 1 and 2.
Figure 5:
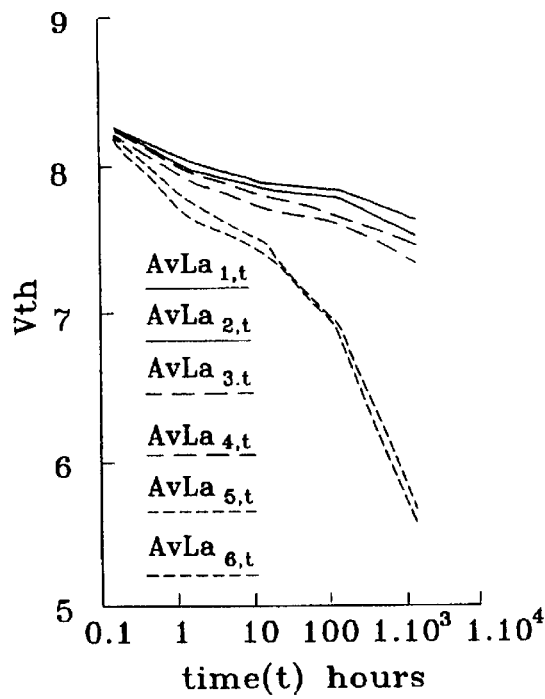
Figure 6:
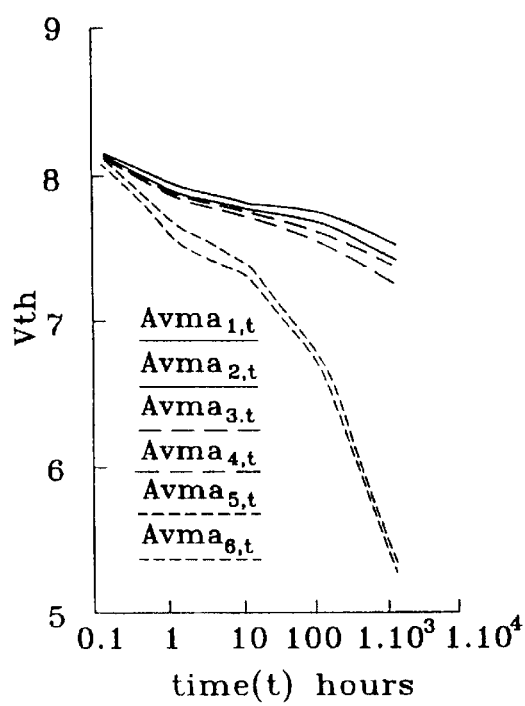
Figure 7:
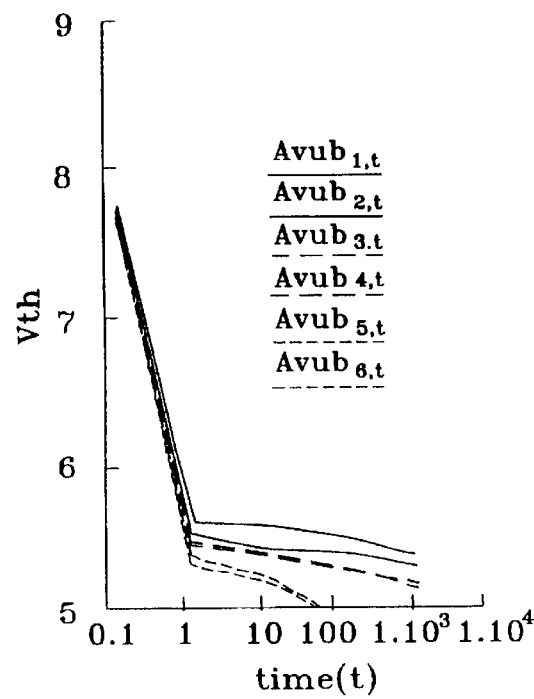
Figure 8:
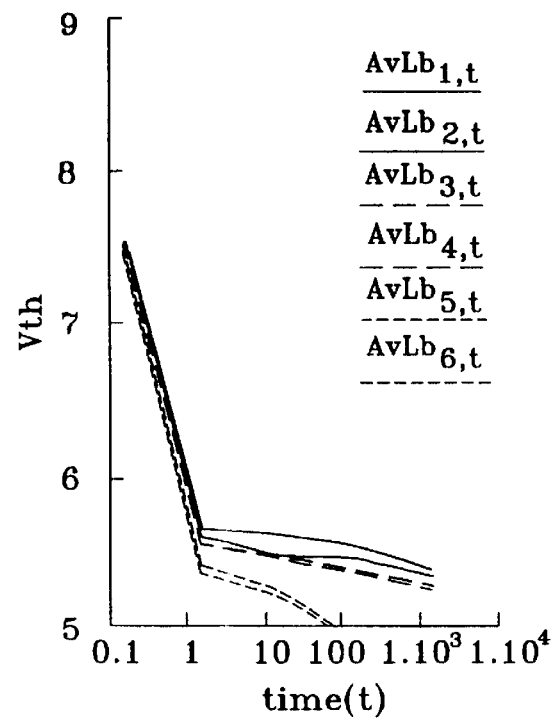
Figure 9:
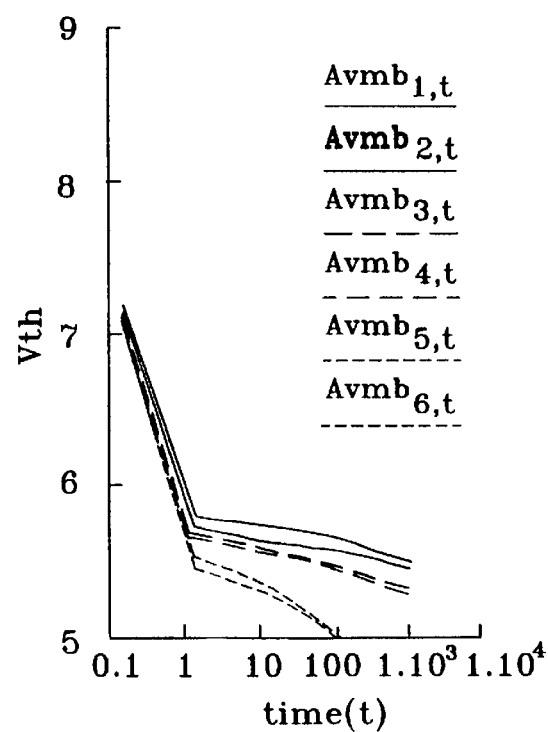

After programming, the control PMT's reached a Vth of about 7.5V, while the PMT's processed in accordance with this invention reached a higher Vth of about 8.5V. The PMT's were then subjected to a standard data retention bake at temperatures of about 160° C., 180° C. or 235° C. As represented by the data plotted in FIGS. 7 through 9, the control PMT'S experienced a rapid initial drop in Vth of between about 1.5 and 2.0V after the first hour of baking. After the initial Vth drop, the control PMT's stabilized and Vth began to drop at a much slower rate. As evidenced by FIGS. 4 through 6, under the same test conditions the PMT's of this invention did not experience an initial drop in Vth, but rather Vth decayed at a slow rate through the entire data retention bake in a similar manner exhibited by the control PMT's after their initial drop in Vth. Given that the programmed Vth was initially higher and that the rate of decay was overall slower, the PMT's of this invention exhibited superior data retention with respect to the control PMT's.

From the results represented in FIGS. 4 through 9, it was concluded that PMT's configured in accordance with this invention are capable of memory retention times of about five orders of magnitude greater than the control PMT's. An explanation was not evident as to why the PMT's of the invention did not experience an initial drop in Vth during the data retention bake. However, it is believed that the P+ injecting diffusion sourced carriers to the lightly-doped NHV diffusion to create an inversion in the surface region of the NHV diffusion, which is suspected of resulting in a more complete electron injection, i.e., few (if any) electrons trapped inside the gate oxide. The higher Vth of the PMT's processed in accordance with the invention was attributed to the P+ stitch contact allowing a higher voltage on the control gate inversion channel.

From the investigation, it was further concluded that the PMT of this invention is characterized by improved testability as a result of a greater measurement sensitivity for defects. More particularly, the initial voltage drop exhibited by prior art PMT's necessitated a prolonged stress test to determine at what level their Vth's would stabilize. By eliminating the initial Vth drop, a defective PMT can be quickly identified by its displaying any rapid drop in Vth after programming.

While the invention has been described in terms of a preferred embodiment, it is apparent that other forms could be adopted by one skilled in the art. For example, doping ranges other than those noted could be employed, the NHV diffusion 44 need not be in a P-well 14 but instead could be formed in another N-type region or in a P-type substrate, and the entire PMT cell could be formed in a P-type substrate. Accordingly, the scope of the invention is to be limited only by the following claims.

What is claimed is:

1. A programmable memory transistor comprising:
   a semiconductor substrate;
   an insulated gate field effect transistor on the substrate, the insulated gate field effect transistor comprising a source region in a surface of the substrate, a drain region in the surface of the substrate, a channel in the surface of the substrate and between the source and drain regions, a gate insulator overlying the channel, and a first floating gate on the gate insulator;
   a capacitor structure on the substrate, the capacitor structure comprising a lightly-doped well of a first conductivity type in the surface of the substrate, a heavily-doped contact diffusion of the first conductivity type in the lightly-doped well, an injecting diffusion of a second conductivity type in the lightly-doped well and spaced apart from the contact diffusion so as to define therebetween a surface region of the lightly-doped well, a control gate insulator overlying the surface region of the lightly-doped well, a second floating gate on the control gate insulator, and a conductor in ohmic contact with the lightly-doped well through the contact diffusion and in further contact with the lightly-doped well through the injecting diffusion; and
   means for electrically connecting the first and second floating gates to maintain the first and second floating gates at the same potential;
   wherein the second floating gate is capacitively coupled to the lightly-doped well through the control gate insulator so as to define a control gate for the first floating gate whereby a sufficient voltage can be applied to the lightly-doped well to cause ejection of electrons from the source region of the insulated gate field effect transistor and trapping some of the ejected electrons in the first floating gate.

2. The programmable memory transistor according to claim 1, wherein the first and second floating gates are electrically connected as a result of being defined by a layer of conductive material on the substrate.

3. The programmable memory transistor according to claim 2, wherein the conductive material is polysilicon.

4. The programmable memory transistor according to claim 1, further comprising conductors in ohmic contact with the source and drain regions of the insulated gate field effect transistor.

5. The programmable memory transistor according to claim 1, wherein the first conductivity type is n-type and the second conductivity type is p-type.

6. The programmable memory transistor according to claim 1, wherein the insulated gate field effect transistor is an NMOS device.

7. The programmable memory transistor according to claim 1, wherein the programmable memory transistor comprises a single polysilicon layer.

8. A programmable memory transistor comprising:
   a semiconductor substrate comprising a p-type surface region;
   an NMOS transistor in the p-type surface region of the substrate, the NMOS transistor comprising an N+ source region, an N+ drain region, a channel between the N+ source and drain regions, a gate insulator overlying the channel, a first polysilicon floating gate on the gate insulator, a first metal conductor in ohmic contact with the N+ source region, and a second metal conductor in ohmic contact with the N+ drain region;
   a capacitor structure in the p-type surface region of the substrate and separated from the NMOS transistor by a field oxide, the capacitor structure comprising a lightly-doped N-well, an N + contact diffusion in the lightly-doped N-well, a P+ injecting diffusion in the lightly-doped N-well and spaced apart from the N + contact diffusion so as to define therebetween a surface region of the lightly-doped N-well, a control gate insulator overlying the surface region of the lightly-doped N-well, a second polysilicon floating gate on the control gate insulator, and a third metal conductor in ohmic contact with the lightly-doped N-well through the N + contact diffusion and in stitch contact with the lightly-doped N-well through the P+ injecting diffusion, a single layer of polysilicon defining the first and second polysilicon floating gates such that the first and second polysilicon floating gates are maintained at the same potential;

wherein the second polysilicon floating gate is capacitively coupled to the lightly-doped N-well through the control gate insulator so as to define a control gate for the first polysilicon floating gate whereby a sufficient voltage can be applied to the lightly-doped N-well to cause ejection of electrons from the N+ source region of the NMOS transistor and trapping some of the ejected electrons in the first polysilicon floating gate, and wherein the P+ injecting diffusion is operable to source carriers to the lightly-doped N-well to create an inversion in the surface region of the lightly-doped N-well as a result of the P+ injecting diffusion being oppositely-doped to the N+ contact diffusion.

9. The programmable memory transistor according to claim 8, wherein the single layer of polysilicon is the only layer of polysilicon in the programmable memory transistor.

* * * * *